United States Patent
Yamaguchi et al.

(10) Patent No.: US 11,923,242 B2
(45) Date of Patent: Mar. 5, 2024

(54) METHOD OF MANUFACTURING SEMICONDUCTOR DEVICE

(71) Applicant: Tokyo Electron Limited, Tokyo (JP)

(72) Inventors: Tatsuya Yamaguchi, Yamanashi (JP); Syuji Nozawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 511 days.

(21) Appl. No.: 17/225,450

(22) Filed: Apr. 8, 2021

(65) Prior Publication Data

US 2021/0320033 A1    Oct. 14, 2021

(30) Foreign Application Priority Data

Apr. 13, 2020   (JP) .................. 2020-071646

(51) Int. Cl.
*H01L 21/768*   (2006.01)
*H01L 21/764*   (2006.01)

(52) U.S. Cl.
CPC ........ *H01L 21/7682* (2013.01); *H01L 21/764* (2013.01); *H01L 21/76859* (2013.01); *H01L 21/76864* (2013.01)

(58) Field of Classification Search
CPC .................................................. H01L 21/7682
See application file for complete search history.

(56) References Cited

U.S. PATENT DOCUMENTS

| | | | | |
|---|---|---|---|---|
| 7,285,474 | B2 * | 10/2007 | Anderson | ........... H01L 23/5329 |
| | | | | 438/421 |
| 7,807,570 | B1 * | 10/2010 | Maxson | .............. H01L 23/5223 |
| | | | | 257/E21.585 |
| 9,576,899 | B2 * | 2/2017 | Jain | ....................... H01L 23/522 |
| 10,854,503 | B2 * | 12/2020 | Sun | ...................... H01L 29/6653 |
| 2016/0141202 | A1 | 5/2016 | Xue et al. | |

FOREIGN PATENT DOCUMENTS

| | | |
|---|---|---|
| JP | 2005-522049 A | 7/2005 |
| JP | 2012-054307 A | 3/2012 |
| WO | 2005091374 A1 | 9/2005 |

* cited by examiner

*Primary Examiner* — Daniel Luke
(74) *Attorney, Agent, or Firm* — Armstrong Teasdale LLP

(57) ABSTRACT

A method of manufacturing a semiconductor device, includes: stacking a thermally-decomposable organic material on a surface of a substrate in which a recess is formed; implanting ions into a surface of the organic material stacked in the recess so as to modify the surface of the organic material and form a modified layer on the surface of the organic material; and heating the substrate to a first temperature so as to thermally decompose the organic material under the modified layer and to desorb the organic material through the modified layer so that an air gap is formed between the modified layer and the recess.

7 Claims, 6 Drawing Sheets

| Ion | Energy [keV] | Amount of ions implanted [ions/cm$^2$] | Evaluation |
|---|---|---|---|
| Phosphorous | 10 | $1.0 \times 10^{15}$ | ○ |
| | 5 | $1.0 \times 10^{15}$ | ○ |
| | 100 | $1.0 \times 10^{15}$ | × |
| | 10 | $1.0 \times 10^{14}$ | × |
| | 10 | $1.0 \times 10^{13}$ | × |
| Carbon | 10 | $1.0 \times 10^{15}$ | ○ |

METHOD OF MANUFACTURING SEMICONDUCTOR DEVICE

CROSS-REFERENCE TO RELATED APPLICATION

This application is based upon and claims the benefit of priority from Japanese Patent Application No. 2020-071646, filed on Apr. 13, 2020, the entire contents of which are incorporated herein by reference.

TECHNICAL FIELD

Various aspects and embodiments of the present disclosure relate to a method of manufacturing a semiconductor device.

BACKGROUND

For example, Patent Document 1 discloses a technique for reducing a relative dielectric constant of an interlayer insulating film by forming an air gap in the interlayer insulating film in a semiconductor device having a multilayer structure. In this technique, when the interlayer insulating film is embedded in a recess in a substrate, a space (void) that causes a defective embedding is formed in the recess, and the formed void is used as the air gap.

PRIOR ART DOCUMENT

[Patent Document]
Patent Document 1: Japanese Laid-Open Patent Publication No. 2012-054307

SUMMARY

According to an embodiment of the present disclosure, there is provided a method of manufacturing a semiconductor device, includes: stacking a thermally-decomposable organic material on a surface of a substrate in which a recess is formed; implanting ions into a surface of the organic material stacked in the recess so as to modify the surface of the organic material and form a modified layer on the surface of the organic material; and heating the substrate to a first temperature so as to thermally decompose the organic material under the modified layer and to desorb the organic material through the modified layer so that an air gap is formed between the modified layer and the recess.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Hereinafter, embodiments of a semiconductor device manufacturing method disclosed herein will be described in detail with reference to the drawings. The semiconductor device manufacturing method disclosed herein is not limited to the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The shape and size of a void to be formed as a defective embedding depend on, for example, the width or depth of a recess. For example, when the width of the recess is narrow, a large void is formed in a lower portion of the recess, but when the width of the recess is wide, almost no void may be formed in the lower portion of the recess. In addition, the shape and size of the void to be formed in the recess may vary depending on a position of the recess on the substrate and a position of the recess inside a semiconductor manufacturing apparatus. Therefore, it is difficult to form a void having a desired shape and size in a recess having an arbitrary shape.

Therefore, a thermally-decomposable organic material is stacked in the recess in the substrate, a sealing film is stacked on the organic material, and then the substrate is heated to allow the thermally decomposed organic material to be desorbed from the recess through the sealing film. This makes it possible to form an air gap having a shape corresponding to the shape of the organic material between the recess and the sealing film. As such a sealing film, for example, a silicon oxide film or the like may be used.

However, after the air gap is formed, when a process such as etching or cleaning is performed under a condition that the sealing film may be damaged, a portion of the sealing film may be damaged. When the sealing film is damaged, the strength of a sidewall forming the air gap is reduced, which makes it difficult to maintain the shape of the air gap. In addition, when a space of the air gap and an external space communicate with each other due to the damage to the sealing film, a gas, a chemical solution, or the like to be used in a subsequent process may infiltrate into the air gap. As a result, residue is generated in the air gap so that the air gap has a shape different from the designed shape, which makes it difficult to achieve a desired relative dielectric constant.

Therefore, the present disclosure provides a technique capable of forming an air gap having a predetermined shape.

[Configuration of Manufacturing System 10]

Figure 1:
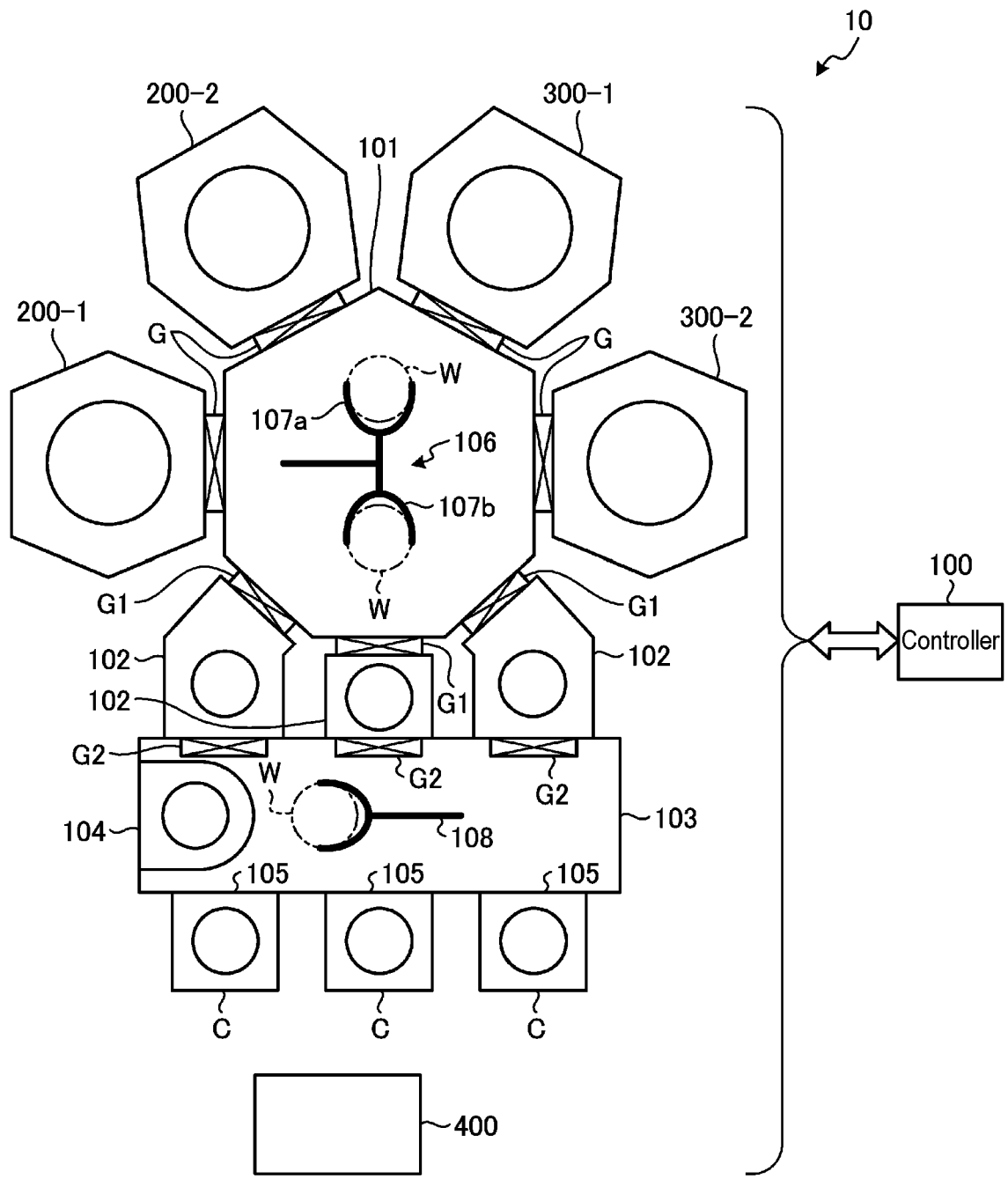
FIG. 1 is a view illustrating an exemplary configuration of a manufacturing system according to an embodiment of the present disclosure.

FIG. 1 is a view illustrating an exemplary configuration of a manufacturing system 10 according to an embodiment of the present disclosure. The manufacturing system 10 includes a stacking apparatus 200-1, a stacking apparatus 200-2, a heating apparatus 300-1, a heating apparatus 300-2, and an ion implantation apparatus 400. The manufacturing system 10 is a multi-chamber-type vacuum processing system. The manufacturing system 10 forms an air gap in a substrate W on which elements used in a semiconductor device are formed using the stacking apparatus 200-1, the stacking apparatus 200-2, the heating apparatus 300-1, the heating apparatus 300-2, and the ion implantation apparatus 400. The stacking apparatus 200-1 and the stacking apparatus 200-2 have the same configuration, and the heating apparatus 300-1 and the heating apparatus 300-2 have the same configuration. In the following description, the stacking apparatus 200-1 and the stacking apparatus 200-2 may be collectively referred to as a "stacking apparatus 200" without being distinguished from each other, and the heating apparatus 300-1 and the heating apparatus 300-2 may be collectively referred to as a "heating apparatus 300" without being distinguished from each other.

The stacking apparatus 200 stacks a thermally-decomposable organic material on the surface of the substrate W in which a recess is formed. In the present embodiment, the thermally-decomposable organic material is a polymer having a urea bond generated by the polymerization of multiple types of monomers. The heating apparatus 300-1 thermally decomposes some of the organic material stacked in the recess of the substrate W by heating the substrate W. The ion implantation apparatus 400 implants ions into the surface of the organic material stacked in the recess of the substrate W, thereby modifying the surface of the organic material into a substance that is hard to be thermally decomposed, and forming the modified layer that is hard to be thermally decomposed on the surface of the organic material. The heating apparatus 300-2 thermally decomposes the organic material under the modified layer by heating the substrate W, and causes the organic material under the modified layer to be desorbed through the modified layer. As a result, the air gap is formed between the modified layer and the recess.

The stacking apparatus 200-1, the stacking apparatus 200-2, the heating apparatus 300-1, and the heating apparatus 300-2 are connected to four sidewalls of a vacuum transfer chamber 101 having a heptagonal planar shape via gate valves G, respectively. Three load lock chambers 102 are connected to the other three sidewalls of the vacuum transfer chamber 101 via gate valves G1, respectively. Each of the three load lock chambers 102 is connected to an atmospheric transfer chamber 103 via a gate valve G2.

The inside of the vacuum transfer chamber 101 is exhausted by a vacuum pump, and is maintained at a predetermined degree of vacuum. Inside the vacuum transfer chamber 101, a transfer mechanism 106, such as a robot arm, is provided. The transfer mechanism 106 transfers the substrate W between the stacking apparatus 200-1, the stacking apparatus 200-2, the heating apparatus 300-1, the heating apparatus 300-2, and each of the load lock chambers 102. The transfer mechanism 106 has two arms 107a and 107b, which are independently movable.

A side surface of the atmospheric transfer chamber 103 is provided with a plurality of ports 105, in each of which a carrier (e.g., front-opening unified pod (FOUP)) C for accommodating the substrates W is mounted. In addition, on a sidewall of the atmospheric transfer chamber 103, an alignment chamber 104 is provided so as to perform alignment of the substrate W. A down-flow of clean air is formed inside the atmospheric transfer chamber 103.

A transfer mechanism 108, such as a robot arm, is provided inside the atmospheric transfer chamber 103. The transfer mechanism 108 transfers the substrate W between each of the carriers C, each of the load lock chambers 102, and the alignment chamber 104.

The substrates W on each of which the organic material is stacked by the stacking apparatus 200 are temporarily accommodated in the carrier C. Then, the substrates W accommodated in the carrier C are loaded into the ion implantation apparatus 400 one by one by a transfer mechanism (not illustrated). Then, the substrates W in each of which ions are implanted into the surface of the organic material by the ion implantation apparatus 400 are again accommodated in the carrier C by a transfer mechanism (not illustrated). Then, the carrier C is set in the port 105 of the atmospheric transfer chamber 103, and the substrates W accommodated in the carrier C are loaded into the load lock chamber 102 by the transfer mechanism 108.

A controller 100 has a memory, a processor, and an input/output interface. The memory stores, for example, a program executed by the processor, a recipe including conditions for each process, and the like. The processor executes the program read from the memory and controls each part of the manufacturing system 10 via the input/output interface based on the recipe stored in the memory.

[Configuration of the Stacking Apparatus 200]

Figure 2:
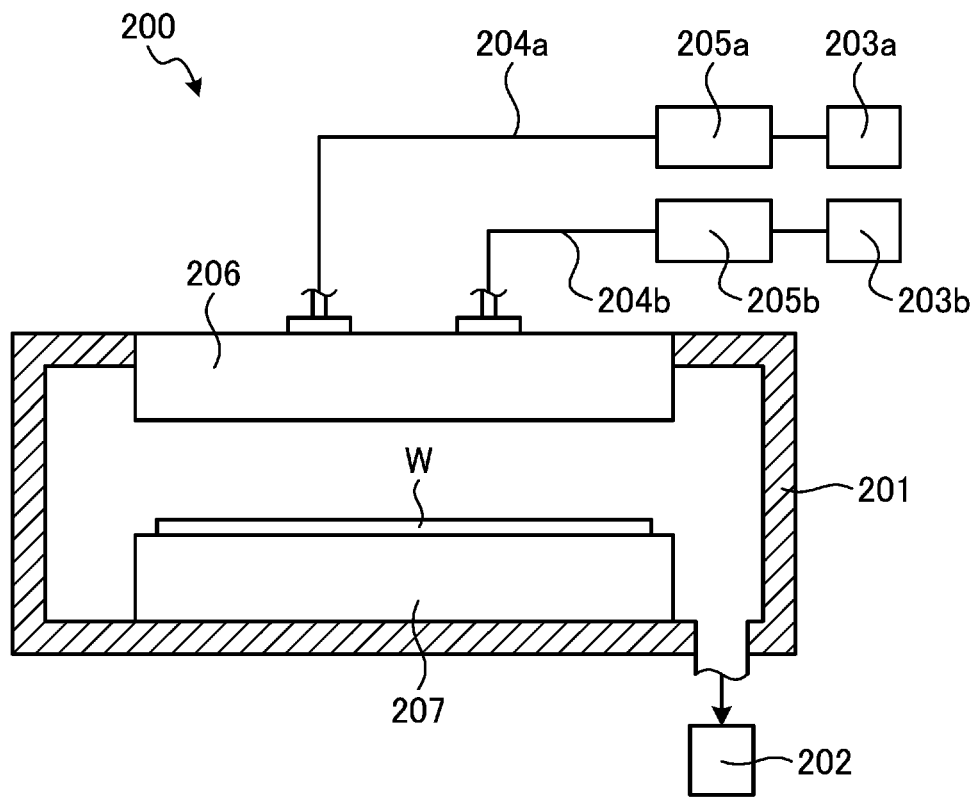
FIG. 2 is a schematic view illustrating an example of a stacking apparatus according to an embodiment of the present disclosure.

FIG. 2 is a view schematically illustrating an example of the stacking apparatus 200 according to an embodiment of the present disclosure. The stacking apparatus 200 includes a container 201, an exhaust device 202, a shower head 206, and a stage 207. In the present embodiment, the stacking apparatus 200 is, for example, a chemical vapor deposition (CVD) apparatus.

The exhaust device 202 exhausts gas from the container 201. The inside of the container 201 is controlled to a vacuum atmosphere having a predetermined pressure by the exhaust device 202.

Multiple types of raw material monomers are supplied to the container 201 through the shower head 206. The multiple types of raw material monomers are, for example, isocyanate and amine. A raw material source 203a configured to store isocyanate in a liquid state is connected to the shower head 206 via a supply pipe 204a. In addition, a raw material source 203b configured to store amine in a liquid state is connected to the shower head 206 via a supply pipe 204b.

The isocyanate liquid supplied from the raw material source 203a is vaporized by a vaporizer 205a disposed in the supply pipe 204a. Then, isocyanate vapor is introduced into the shower head 206, which is a gas ejection part, through the supply pipe 204a. In addition, the amine liquid supplied from the raw material source 203b is vaporized by a vaporizer 205b disposed in the supply pipe 204b. Then, amine vapor is introduced into the shower head 206 through the supply pipe 204b.

The shower head 206 is provided in, for example, an upper portion of the container 201, and has a bottom surface in which a large number of ejection holes are formed. The shower head 206 ejects the isocyanate vapor and the amine vapor, which are introduced through the supply pipe 204a and the supply pipe 204b, respectively, into the container 201 from separate ejection holes in the form of a shower.

The stage 207 having a temperature control mechanism (not illustrated) is provided inside the container 201. The substrate W having the recess formed in the surface thereof is placed on the stage 207. The stage 207 controls a temperature of the substrate W using the temperature control mechanism such that the substrate W has a temperature suitable for vapor deposition polymerization of the raw material monomers, which are supplied from the raw material source 203a and the raw material source 203b, respectively. The temperature suitable for vapor deposition polymerization may be determined depending on the types of the raw material monomers, and may be, for example, 40 degrees C. to 150 degrees C.

By causing the two types of raw material monomers to undergo the vapor deposition polymerization reaction on the surface of the substrate W using the stacking apparatus 200, the organic material is stacked on the surface of the substrate W in which the recess is formed. When the two types of raw material monomers are isocyanate and amine, a film of polymer of polyurea is stacked on the surface of the substrate W. The polymer of polyurea is an example of the thermally-decomposable organic material.

[Configuration of the Heating Apparatus 300]

Figure 3:
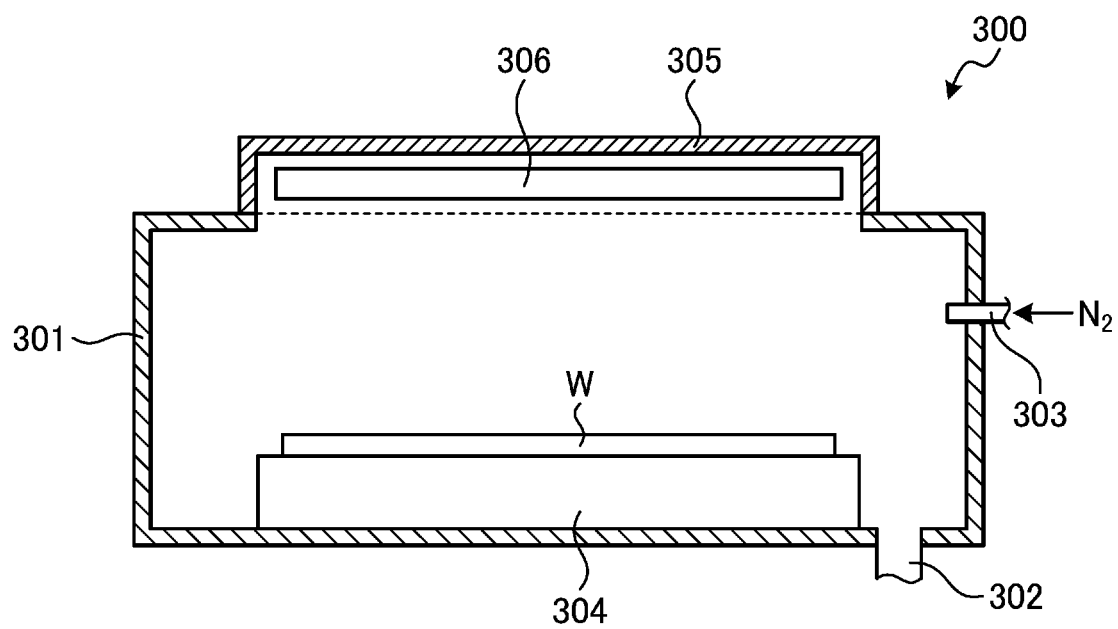
FIG. 3 is a schematic view illustrating an example of a heating apparatus according to an embodiment of the present disclosure.

FIG. 3 is a view schematically illustrating an example of the heating apparatus 300 according to an embodiment of the present disclosure. The heating apparatus 300 includes a container 301, an exhaust pipe 302, a supply pipe 303, a stage 304, a lamp house 305, and an infrared lamp 306.

The stage 304 is provided inside the container 301 so as to place the substrate W thereon. The lamp house 305 is provided at a position facing a surface of the stage 304 on which the substrate W is placed. The infrared lamp 306 is disposed inside the lamp house 305.

An inert gas is supplied into the container 301 through the supply pipe 303. In the present embodiment, the inert gas is, for example, a $N_2$ gas.

The inert gas is supplied into the container 301 through the supply pipe 303 in the state in which the substrate W is placed on the stage 304. Then, the substrate W having the organic material stacked in the recess is heated by turning on the infrared lamp 306. When the organic material stacked in the recess of the substrate W reaches a predetermined temperature, the organic material is thermally decomposed into two types of raw material monomers. In the present embodiment, since the organic material is polyurea, when the substrate W is heated to 300 degrees C. or higher, for example, 500 degrees C., the organic material is depolymerized into isocyanate and amine, which are the raw material monomers.

[Configuration of the Ion Implantation Apparatus 400]

Figure 4:
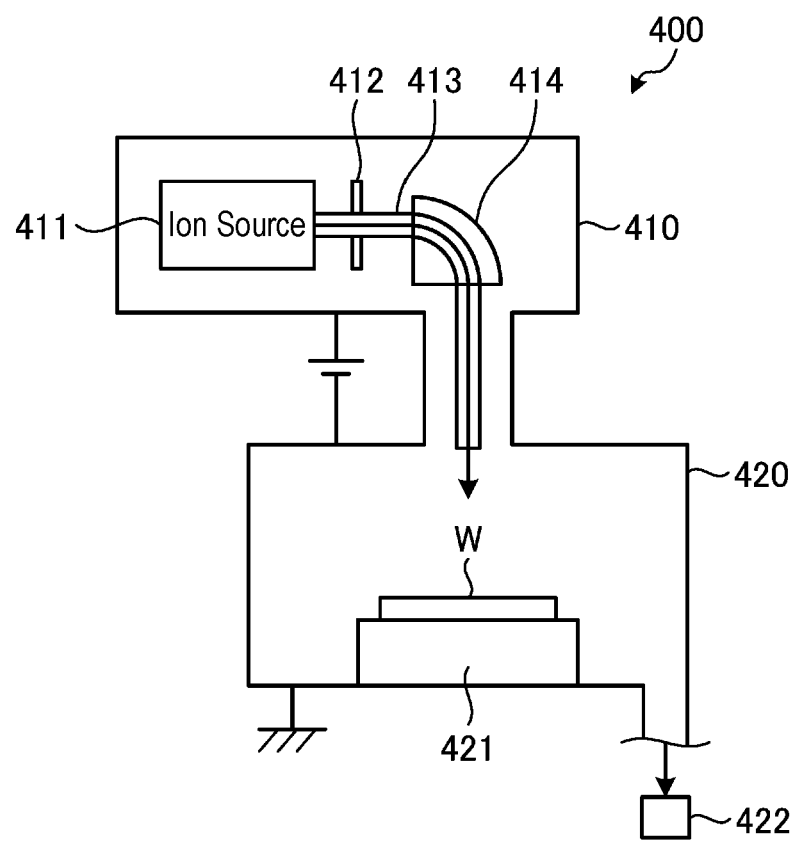
FIG. 4 is a schematic view illustrating an example of an ion implantation apparatus according to an embodiment of the present disclosure.

FIG. 4 is a schematic view illustrating an example of the ion implantation apparatus 400 according to an embodiment of the present disclosure. The ion implantation apparatus 400 includes an ion supply chamber 410 and a processing chamber 420.

An ion source 411, an extraction electrode 412, a beam line 413, and an analyzer 414 are provided inside the ion supply chamber 410. The ion source 411 generates ions. The ions generated from the ion source 411 are extracted into the beam line 413 by a voltage applied between the ion source 411 and the extraction electrode 412. The analyzer 414 separates ions of a specific element such as phosphorus, carbon or the like from the ions extracted into the beam line 413 based on a difference in mass and charge. In this embodiment, the analyzer 414 separates carbon ions. The ions of the element separated by the analyzer 414 pass through the beam line 413, are accelerated by the voltage applied between the ion supply chamber 410 and the processing chamber 420, and are released into the processing chamber 420.

The exhaust device 422 exhausts a gas from the processing chamber 420. The inside of the processing chamber 420 is controlled to a vacuum atmosphere having a predetermined pressure by the exhaust device 422. A stage 421 is provided inside the processing chamber 420. The substrate W having the organic material stacked in the recess is placed on the stage 421. The ions generated in the ion supply chamber 410 are released to the surface of the substrate W placed on the stage 421. As a result, the ions are implanted into the surface of the organic material stacked in the recess of the substrate W.

[Method of Forming the Air Gap]

Figure 5:
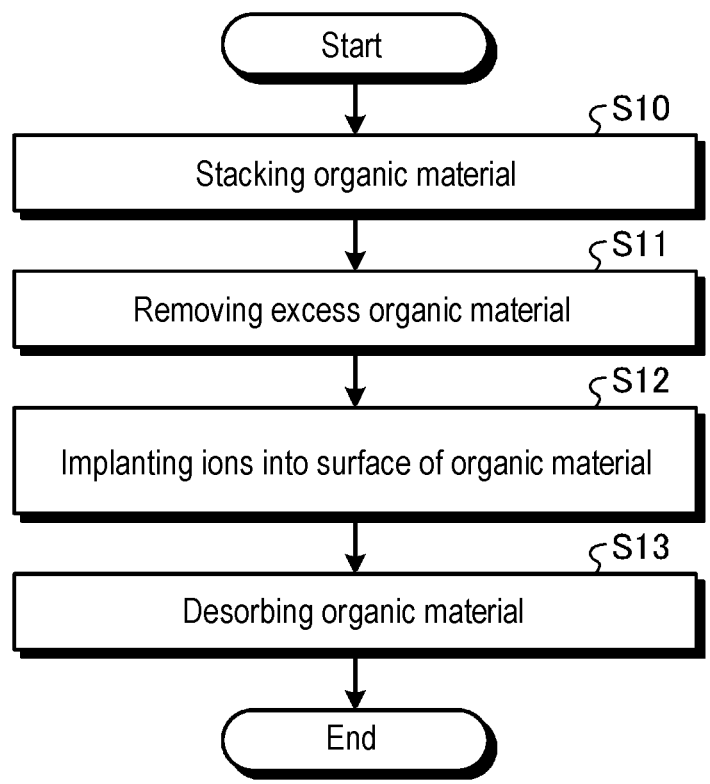
FIG. 5 is a flowchart illustrating an example of a semiconductor device manufacturing method.

FIG. 5 is a flowchart illustrating an example of a semiconductor device manufacturing method. When the substrate W having the recess formed therein is loaded into the stacking apparatus 200 by, for example, the transfer mechanism 106, a process illustrated in FIG. 5 is started.

Figure 6:
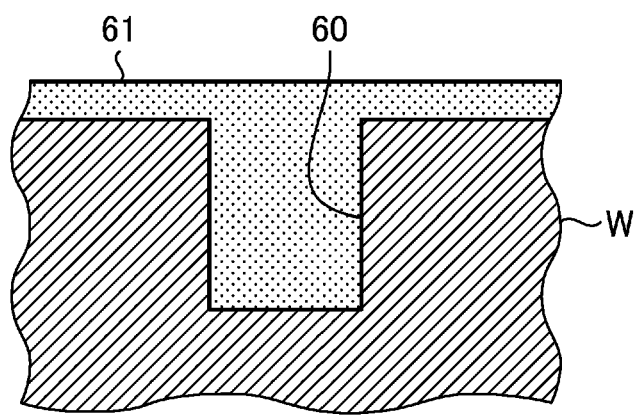
FIG. 6 is a view schematically illustrating an example of a semiconductor device manufacturing process.

First, the thermally-decomposable organic material is stacked on the substrate W using the stacking apparatus 200 (S10). Step S10 is an example of a stacking step. As a result, for example, as illustrated in FIG. 6, an organic material 61 is stacked in a recess 60 of the substrate W. Then, the substrate W is unloaded from the stacking apparatus 200 by the transfer mechanism 106, and is loaded into the heating apparatus 300-1.

Figure 7:
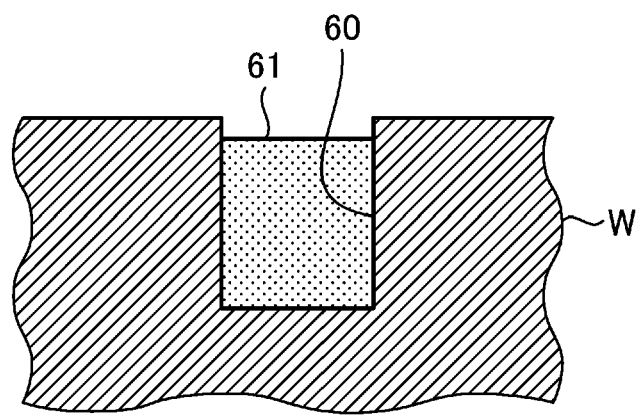
FIG. 7 is a view schematically illustrating an example of the semiconductor device manufacturing process.

Subsequently, the substrate W is heated by the heating apparatus 300-1, whereby the excess organic material stacked on the substrate W is removed (S11). Step S11 is an example of a removal step. In step S11, the substrate W is heated by the heating apparatus 300-1 to a temperature in a range of, for example, 200 degrees C. to 300 degrees C. The temperature in the range of 200 degrees C. to 300 degrees C. is an example of a second temperature. As a result, for example, as illustrated in FIG. 7, some of the organic material 61 stacked on the top surface of the substrate W is desorbed by thermal decomposition. In addition, in some embodiments, the excess organic material stacked on the substrate W may be removed by irradiating the surface of the substrate W with plasma. For example, the excess organic material stacked on the substrate W may be removed through ashing using oxygen, hydrogen, carbon dioxide, or the like activated by exciting a gas such as argon, helium, nitrogen or the like using plasma. Then, the substrate W is loaded into the load lock chamber 102 from the heating apparatus 300-1 by the transfer mechanism 106, is unloaded from the load lock chamber 102 by the transfer mechanism 108, and is accommodated in the carrier C. Then, the carrier C is set in the ion implantation apparatus 400, and the substrate W accommodated in the carrier C is loaded into the ion implantation apparatus 400 through a transfer mechanism (not illustrated).

Figure 8:
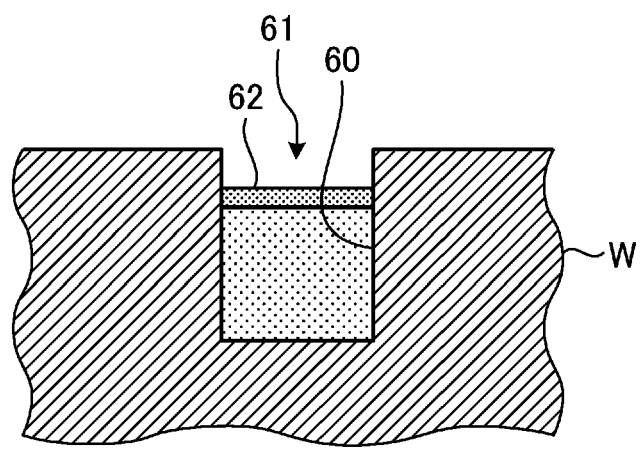
FIG. 8 is a view schematically illustrating an example of the semiconductor device manufacturing process.

Subsequently, ions are implanted into the surface of the organic material 61 stacked in the recess 60 of the substrate W by the ion implantation apparatus 400 (S12). Step S12 is an example of an implantation step. When the ions are implanted into the surface of the organic material 61, the surface of the organic material 61 is modified, and for example, as illustrated in FIG. 8, a modified layer 62 is formed on the surface of the organic material 61. In the present embodiment, by implanting carbon ions into the surface of the substrate W, the surface of the organic material 61 is carbonized so that the modified layer 62, which is a carbonized layer, is formed on the surface of the organic material 61. Then, the substrate W is unloaded from the ion implantation apparatus 400 by a transfer mechanism (not illustrated) and is accommodated in the carrier C again. Then, the carrier C is set in the port 105 of the atmospheric transfer chamber 103, and the substrate W accommodated in the carrier C is loaded into the load lock chamber 102 by the transfer mechanism 108. Then, the substrate W loaded into the load lock chamber 102 is unloaded from the load lock chamber 102 by the transfer mechanism 106 and is loaded into the heating apparatus 300-2.

Figures 9, 10:
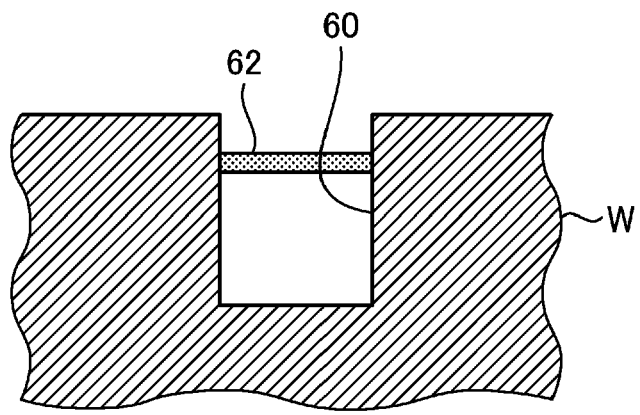
FIG. 9 is a view schematically illustrating an example of the semiconductor device manufacturing process.
FIG. 10 is a view schematically illustrating an example of test results.

Subsequently, the substrate W is heated by the heating apparatus 300-2, whereby the organic material 61 in the recess 60 is desorbed through the modified layer 62 (S13). Step S13 is an example of a desorption step. In step S13, the substrate W is heated to, for example, 300 degrees C. or higher by the heating apparatus 300-2. The temperature of 300 degrees C. or higher is an example of a first temperature. As a result, the organic material 61 under the modified layer 62 is thermally decomposed and desorbed through the modified layer 62, and, for example, as illustrated in FIG. 9, an air gap having a shape corresponding to the shape of the organic material 61 is formed between the modified layer 62 and the recess 60. Then, the process illustrated in this flowchart ends.

[Relationship between Energy and Amount of Implanted Ions]

Next, a test was conducted to investigate a relationship between energy and amount of implanted ions suitable for forming the modified layer 62 capable of forming the air gap. FIG. 10 is a view illustrating an example of the test results. Among the combinations of the energy and amount of implanted ions illustrated in FIG. 10, the combinations that succeeded in forming the air gap are indicated by "o" in the evaluation column, and the combinations that failed to form the air gap are indicated by "x" in the evaluation column.

When phosphorus ions were used as the ions implanted into the surface of the organic material 61, when the amount of implanted ions was less than $1.0\times10^{15}$ ions/cm$^2$, the modified layer 62 was desorbed together with the organic material 61 under the modified layer 62, and thus no air gap was formed. The reason for this is considered to be that when the amount of implanted ions is less than $1.0\times10^{15}$ ions/cm$^2$, the modified layer 62 is not formed with a sufficient strength. This tendency was true in a case where the ions were carbon. Therefore, the amount of implanted ions is preferably $1.0\times10^{15}$ ions/cm$^2$ or more.

In addition, even in a case where the amount of implanted ions was $1.0\times10^{15}$ ions/cm$^2$ or more, no air gap was formed when the energy of implanted ions was 100 keV. The reason for this is considered to be that when the energy of implanted ions was too high, the ions were implanted deep into the organic material 61, and all of the organic material 61 in the recess 60 was modified into a substance that is hard to be thermally decomposed.

Meanwhile, in a case where the amount of implanted ions was $1.0\times10^{15}$ ions/cm$^2$ or more and the energy of implanted ions was within the range of 5 keV to 10 keV, the air gap was formed. That is, in the range in which the formation of the air gap was confirmed in the test, the amount of implanted ions is preferably $1.0\times10^{15}$ ions/cm$^2$ or more, and the energy of implanted ions is preferably in a range of 5 keV to 10 keV.

In the foregoing, embodiments have been described. As described above, the semiconductor device manufacturing method according to the present embodiment includes the stacking step, the implantation step, and the desorption step. In the stacking step, the thermally-decomposable organic material 61 is stacked on the substrate W having the recess 60 formed therein. In the implantation step, ions are implanted into the surface of the organic material 61 stacked in the recess 60, whereby the surface of the organic material 61 is modified, and the modified layer 62 is formed on the surface of the organic material 61. In the desorption step, when the substrate W is heated to the first temperature as a predetermined temperature, the organic material 61 under the modified layer 62 is thermally decomposed, and the organic material 61 under the modified layer 62 is desorbed through the modified layer, whereby the air gap is formed between the modified layer 62 and the recess 60. This makes it possible to form the air gap having a predetermined shape.

The semiconductor device manufacturing method according to the above-described embodiment includes the removal step of removing the organic material 61 stacked on the surface of the substrate W except for the organic material stacked in the recess 60 by heating the substrate W to the second temperature lower than the first temperature, after the stacking step. The implantation step is performed after the removal step. This makes it possible to form the air gap in the recess 60. In addition, in some embodiments, the excess organic material stacked on the substrate W may be removed by irradiating the surface of the substrate W with plasma. For example, the excess organic material stacked on the substrate W may be removed through ashing using oxygen, hydrogen, carbon dioxide, or the like, activated by exciting a gas such as argon, helium, nitrogen or the like using plasma.

In the implantation step of the above-described embodiment, the amount of implanted ions is $1.0\times10^{15}$ ions/cm$^2$ or more, and the energy of implanted ions is 5 keV to 10 keV or less. This makes it possible to form the air gap having a predetermined shape.

In addition, in the above-described embodiment, the ions implanted into the surface of the organic material 61 are phosphorus ions or carbon ions. This makes it possible to form the air gap having a predetermined shape.

[Others]

The technology disclosed herein is not limited to the embodiments described above, and various modifications are possible within the scope of the gist of the present disclosure.

For example, in the above-described embodiments, the ions are implanted into the surface of the organic material 61 embedded in the recess 60 using the ion implantation apparatus 400, but the technique disclosed herein is not limited thereto. In some embodiments, ions may be implanted into the surface of the organic material 61 using plasma. For example, a gas containing an element to be implanted is formed into plasma inside the chamber, and a negative bias voltage is applied to the substrate W arranged inside the chamber. As a result, ions in the plasma are drawn into the surface of the substrate W and implanted into the surface of the organic material 61. This process can be implemented by, for example, a capacitively coupled plasma processing apparatus or the like.

In the above-described embodiments, a polymer having a urea bond was used as an example of the polymer constituting the organic material. However, a polymer having a bond other than a urea bond may be used as the polymer constituting the organic material. The polymer having a bond other than the urea bond may be, for example, polyurethane having a urethane bond. Polyurethane may be synthesized, for example, by copolymerizing a monomer having an alcohol group and a monomer having an isocyanate group. In addition, the polyurethane is depolymerized into a monomer having an alcohol group and a monomer having an isocyanate group by being heated to a predetermined temperature.

In the above-described embodiments, the manufacturing system 10 includes the heating apparatus 300-1 and the heating apparatus 300-2, but in some embodiments, the manufacturing system 10 may include a single heating apparatus 300. In this case, the removal step S11 and the desorption step S13 are performed in the same heating apparatus 300. This makes it possible to reduce an area required to install the manufacturing system 10.

According to the present disclosure in various aspects and embodiments, it is possible to form an air gap having a predetermined shape.

It should be noted that the embodiments disclosed herein are exemplary in all respects and are not restrictive. Indeed, the above-described embodiments can be implemented in various forms. The above-described embodiments may be omitted, replaced or modified in various forms without departing from the scope and spirit of the appended claims.

What is claimed is:

1. A method of manufacturing a semiconductor device, the method comprising:
    stacking a thermally-decomposable organic material on a surface of a substrate in which a recess is formed;
    implanting ions into a surface of the organic material stacked in the recess so as to modify the surface of the organic material and form a modified layer on the surface of the organic material; and
    heating the substrate to a first temperature so as to thermally decompose the organic material under the modified layer and to desorb the organic material through the modified layer so that an air gap is formed between the modified layer and the recess.

2. The method of claim 1, further comprising:
    removing the organic material stacked on the surface of the substrate except for the organic material stacked in the recess by heating the substrate to a second temperature lower than the first temperature, which occurs after the stacking the thermally-decomposable organic material,
    wherein the implanting the ions is performed after the removing the organic material.

3. The method of claim 2, wherein, in the implanting the ions, an amount of the ions implanted is $1.0 \times 10^{15}$ ions/cm$^2$ or more, and energy of the ions implanted is in a range of 5 keV to 10 keV.

4. The method of claim 3, wherein the ions are phosphorus ions or carbon ions.

5. The method of claim 1, further comprising:
    removing the organic material stacked on the surface of the substrate except for the organic material stacked in the recess by irradiating the surface of the substrate with a plasma, which occurs after the stacking the thermally-decomposable organic material,
    wherein the implanting the ions is performed after the removing the organic material.

6. The method of claim 1, wherein, in the implanting the ions, an amount of the ions implanted is $1.0 \times 10^{15}$ ions/cm$^2$ or more, and energy of the ions implanted is in a range of 5 keV to 10 keV.

7. The method of claim 1, wherein the ions are phosphorus ions or carbon ions.

* * * * *